United States Patent
Park et al.

(10) Patent No.: US 8,263,963 B2
(45) Date of Patent: Sep. 11, 2012

(54) PHASE CHANGE MEMORY DEVICE

(75) Inventors: Young-Lim Park, Gyeonggi-do (KR); Sung-Lae Cho, Gyeonggi-do (KR); Byoung-Jae Bae, Gyeonggi-do (KR); Jin-Il Lee, Gyeonggi-do (KR); Hye-Young Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/082,557

(22) Filed: Apr. 8, 2011

(65) Prior Publication Data
US 2011/0180774 A1 Jul. 28, 2011

Related U.S. Application Data

(62) Division of application No. 12/136,176, filed on Jun. 10, 2008, now Pat. No. 7,943,502.

(30) Foreign Application Priority Data

Jun. 15, 2007 (KR) .......... 10-2007-0059001

(51) Int. Cl.
H01L 47/00 (2006.01)
H01L 29/40 (2006.01)

(52) U.S. Cl. .......... 257/4; 257/774
(58) Field of Classification Search .......... None
See application file for complete search history.

(56) References Cited

U.S. PATENT DOCUMENTS

| 6,927,410 | B2 | 8/2005 | Chen | |
|---|---|---|---|---|
| 2005/0212024 | A1* | 9/2005 | Happ | 257/296 |
| 2006/0011902 | A1* | 1/2006 | Song et al. | 257/4 |
| 2006/0043354 | A1 | 3/2006 | Pinnow et al. | |
| 2006/0138393 | A1 | 6/2006 | Seo et al. | |
| 2006/0180811 | A1 | 8/2006 | Lee et al. | |
| 2006/0186440 | A1 | 8/2006 | Wang et al. | |
| 2006/0197130 | A1 | 9/2006 | Suh et al. | |
| 2006/0208847 | A1* | 9/2006 | Lankhorst et al. | 338/9 |
| 2007/0111429 | A1 | 5/2007 | Lung | |
| 2007/0215853 | A1 | 9/2007 | Park et al. | |
| 2008/0108174 | A1 | 5/2008 | Park et al. | |
| 2008/0108175 | A1 | 5/2008 | Shin et al. | |
| 2008/0142777 | A1* | 6/2008 | Park et al. | 257/4 |
| 2008/0164580 | A1 | 7/2008 | Gardner et al. | |
| 2008/0283812 | A1* | 11/2008 | Liu | 257/2 |
| 2009/0078924 | A1* | 3/2009 | Liang et al. | 257/3 |
| 2009/0124039 | A1 | 5/2009 | Roeder et al. | |
| 2009/0305458 | A1 | 12/2009 | Hunks et al. | |

FOREIGN PATENT DOCUMENTS

| JP | 2006-225390 | 8/2006 |
|---|---|---|
| KR | 1020060023049 A | 3/2006 |
| KR | 1020060074236 A | 7/2006 |
| KR | 1020060091160 A | 8/2006 |
| KR | 10666876 B1 | 1/2007 |
| KR | 1020070023433 A | 2/2007 |

OTHER PUBLICATIONS

Notice of Allowance corresponding to Korean Application No. 10-2007-0059001 dated Dec. 23, 2008.

* cited by examiner

Primary Examiner — Scott B Geyer
(74) Attorney, Agent, or Firm — Myers Bigel Sibley & Sajovec, PA

(57) ABSTRACT

Provided are a phase change memory device and a method for forming the phase change memory device. The method includes forming a phase change material layer by providing reactive radicals to a substrate. The reactive radicals may comprise precursors for a phase change material and nitrogen.

7 Claims, 13 Drawing Sheets

PHASE CHANGE MEMORY DEVICE

CROSS-REFERENCE TO RELATED APPLICATIONS

This application is a divisional application of U.S. patent application Ser. No. 12/136,176, filed Jun. 10, 2008, issued as U.S. Pat. No. 7,943,502, and claims priority under 35 U.S.C. §119 of Korean Patent Application No. 10-2007-0059001, filed on Jun. 15, 2007, the disclosures of which are hereby incorporated by reference in their entireties.

FIELD AND BACKGROUND OF THE INVENTION

The present invention disclosed herein relates to a semiconductor device, and more particularly, to a phase change memory device and a method of forming the same.

Phase change materials are capable of embodying at least two recognizably different states—for example, a crystalline state and an amorphous state, plus at least one or more intermediate states, and thus may be used as materials in memory devices. An amorphous state displays a higher specific resistance than a crystalline state, and intermediate states display specific resistances between those of the amorphous and crystalline states.

Phase changing of a phase change material may occur according to changes in temperature, which may be induced, for example, through heating a resistor employing a conductor connected to a phase change material. Heating of a resistor may be achieved through an electrical signal (a current, for example) applied to both ends of the phase change material. The resistance value is related to the contacting area between a phase change material and a conductor connected thereto, where the smaller the contacting area is, the greater the resistance value becomes. Based on the same current amperage, the greater the resistance value, the more effective the heating of a phase change material is. Thus, to achieve a phase change memory device having low operating power requirements, the contacting area between the phase change material and the conductor connected thereto needs to be minimized.

SUMMARY OF THE INVENTION

Present embodiments provide a phase change memory device including a phase change material, and a method of forming the same.

Embodiments of the present invention provide methods for forming a phase change memory device, the methods including forming a phase change material layer by providing reactive radicals to a substrate, the reactive radicals comprising precursors for a phase change material and nitrogen.

In other embodiments of the present invention, methods for forming a phase change memory device are provided, the methods include forming a first dielectric layer having a first opening on a substrate; forming a phase change material layer in the first opening by providing reactive radicals comprising precursors for a phase change material and nitrogen to the substrate; and forming a conductor on the phase change material layer.

In still other embodiments of the present invention, phase change memory devices include a substrate including a first conductor; a first dielectric layer having an opening exposing the first conductor; a phase change material layer provided within the opening; and a second conductor provided on the phase change material layer, wherein the phase change material layer has a width of about 50 nm or less.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention.

FIGS. 1A through 7A are sectional views illustrating a phase change memory device and a method of forming the same according to an embodiment of the present invention;

FIGS. 1B through 7B are sectional views taken along lines I-I in FIGS. 1 through 7(A), respectively;

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms first and second are used herein to describe various elements, these elements should not be limited by these terms. These terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration. In the figures, the sizes of the elements and the relative sizes between elements may be exaggerated for further understanding of the present invention. Furthermore, shapes of the elements illustrated in the figures may vary with variations according to the fabrication process. Therefore, it will be understood that the embodiments disclosed in this specification includes some variations without limitations to the shapes as illustrated in the figures. For example, it will be understood that the use of terms such as "substantially" or "about" to describe elements in the present specification denotes that such elements with variations in shape due to process tolerances shall be deemed included in this specification.

Referring to FIGS. 1A through 7B, a phase change memory device and a method of forming the same according to an embodiment of the present invention will be described.

Figure 1A:
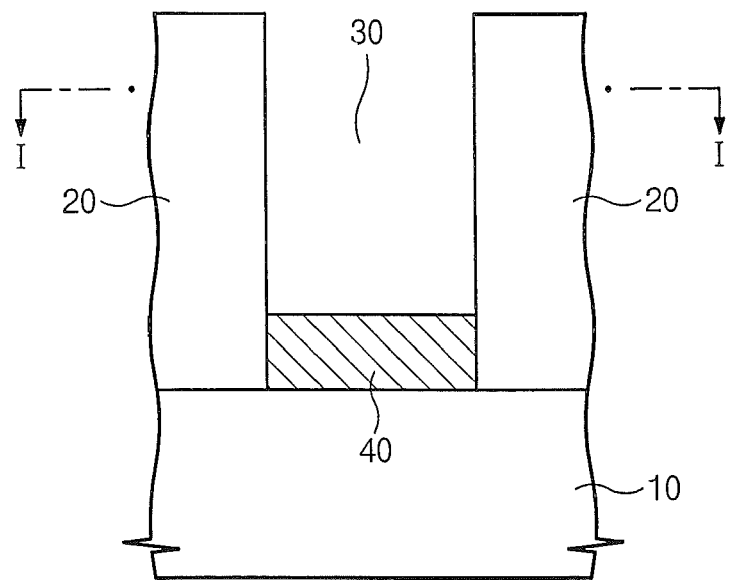
Figure 1B:
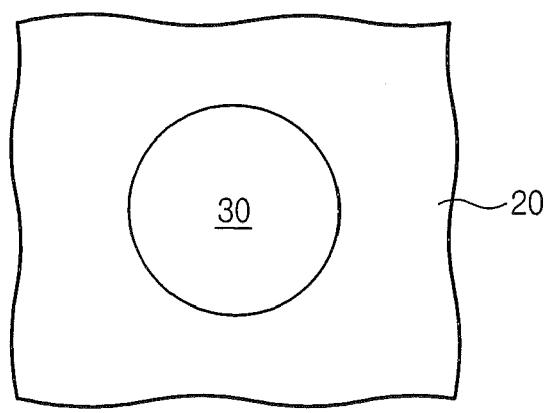

Referring to FIGS. 1A and 1B, a first dielectric may be formed to define a first opening 30 on a substrate 10. The first dielectric 20 may be formed of, for example, a silicon oxide material, a silicon nitride material, a silicon oxide nitride material, or combinations thereof. The first opening 30 may be formed, for example, by performing etching to remove a predetermined region of the first dielectric 20.

A conductive pattern 40 may be formed on the floor of the first opening 30. The conductive pattern 40 may be formed, for example, with a planarization process such as chemical metal polishing (CMP) and/or an etch back process, after a conductive layer is formed on the first dielectric 20, to fill the first opening 30. The conductive pattern 40 may be formed of tungsten, for example.

Figure 2A:
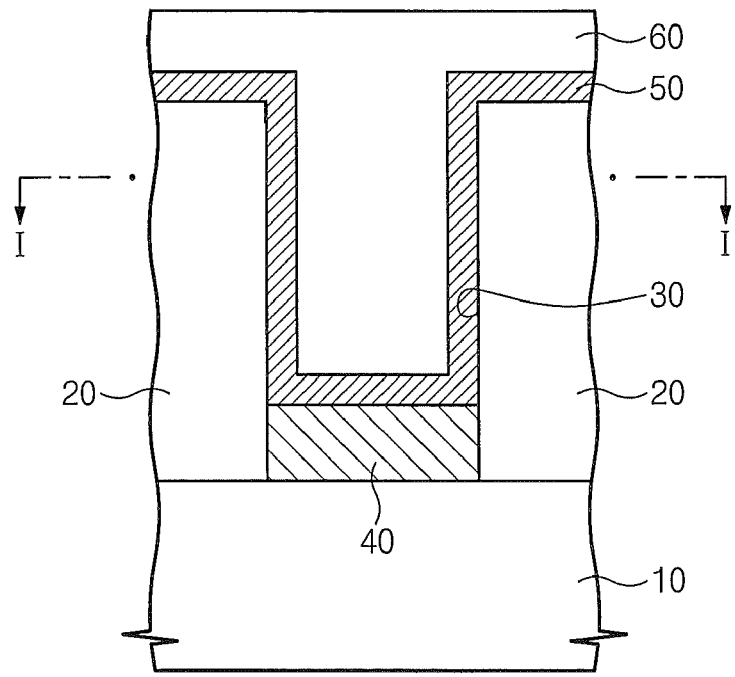
Figure 2B:
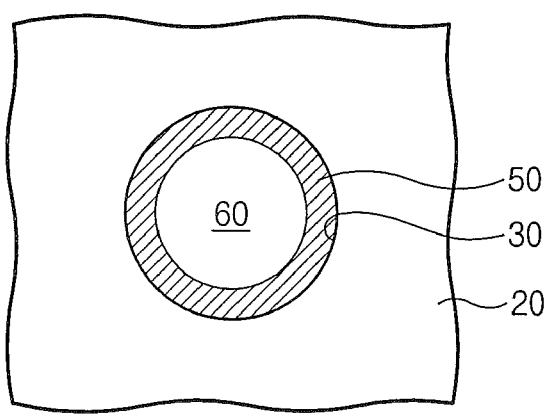

Referring to FIGS. 2A and 2B, a conductive layer 50 for a first conductor may be formed along the sidewalls and floor of the first opening 30. The conductive layer 50 may include a first region 50a formed on the floor of the first opening 30 and a second region 50b formed on the sidewalls of the first opening 30. A dielectric 60 may be formed on the conductive layer 50 to fill the first opening 30.

The conductive layer 50 for the first conductor may be formed of titanium nitride using an atomic layer deposition (ALD) process or a chemical vapor deposition (CVD) process, for example. The dielectric 60 may be formed, for example, of a silicon oxide material, a silicon nitride material, a silicon oxide nitride material, or a combination thereof through performing a CVD process. Also, the dielectric 60 may be formed of titanium oxide, tantalum oxide, zirconium oxide, manganese oxide, hafnium oxide, magnesium oxide, indium oxide, niobium oxide, germanium oxide, antimony oxide, tellurium oxide, or a combination thereof.

Figure 3A:
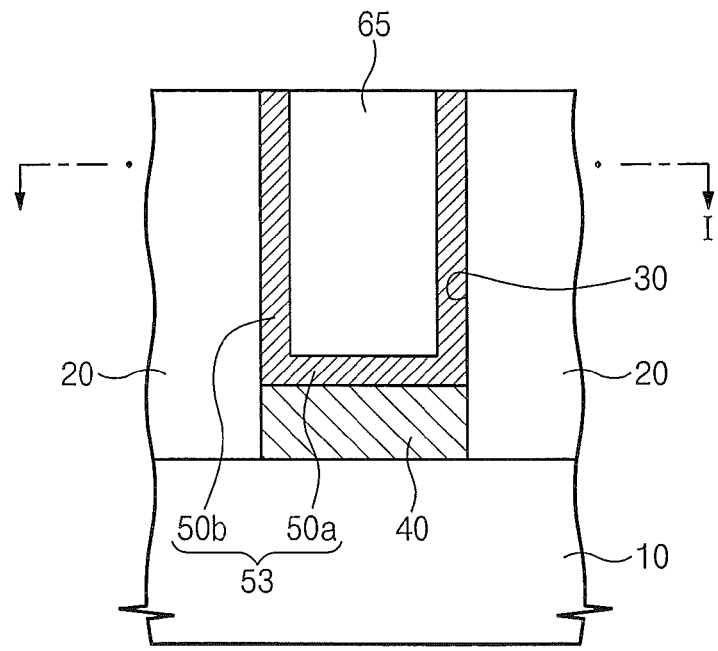
Figure 3B:
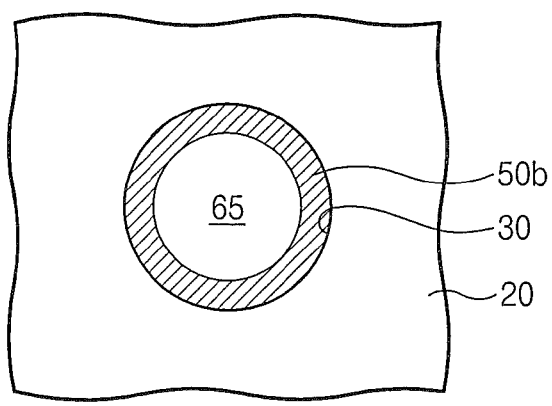

Referring to FIGS. 3A and 3B, a CMP process and/or an etch back process may be performed to remove the dielectric 60 and the conductive layer 50 outside of the first opening 30. Accordingly, a conductive layer 53 and a second dielectric 65 may be formed within the first opening 30 and limited thereto.

Figure 4A:
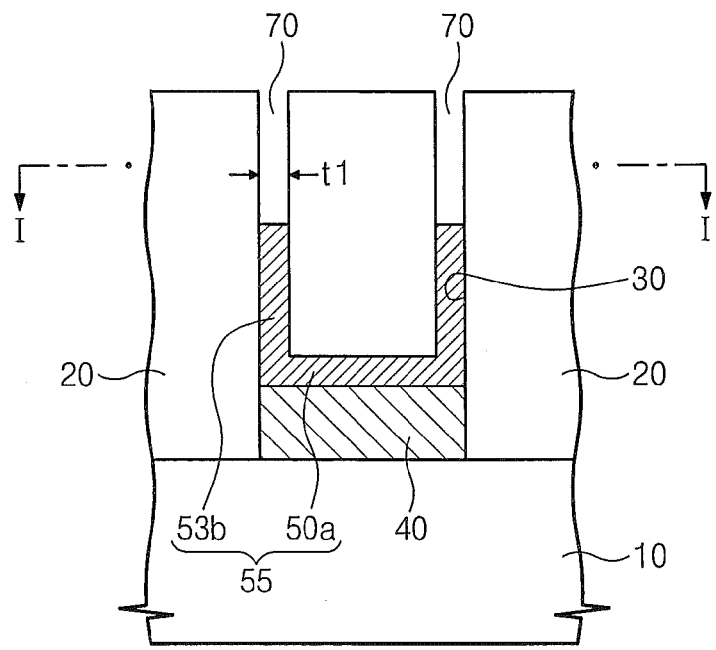
Figure 4B:
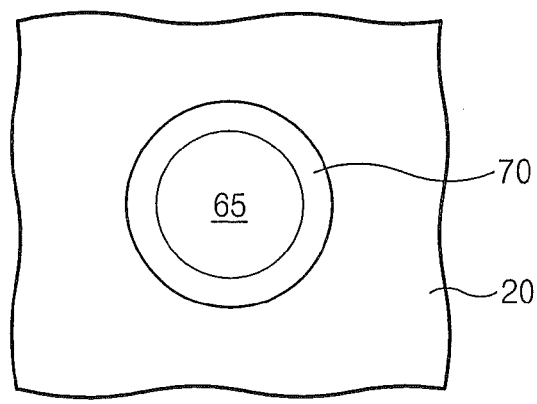

Referring to FIGS. 4A and 4B, the conductive layer may be removed from the second region 50b of the conductive layer 53 (that is, from the upper sidewalls of the first opening 30), forming a first conductor 55. Removal of a portion of the second region 50b may be performed through an etching process, for example, an etch back process. Thus, a second region 53b of the first conductor 55 with an upper surface lower than the upper surface of the second dielectric 65 may be formed, and a second opening 70 for a phase change material layer may be defined between the first dielectric 20 and the second dielectric 65. The width (t1) of the second opening 70 may be about 50 nm or less. For example, the width (t1) of the second opening may range from about 5 nm to about 50 nm. The second opening 70 may be annular in shape. The amount by which the conductive layer 53 is removed may be varied, depending on widths of the first and second openings 30 and 70 and the width of the second region 53b of the first conductor 55.

Figure 5A:
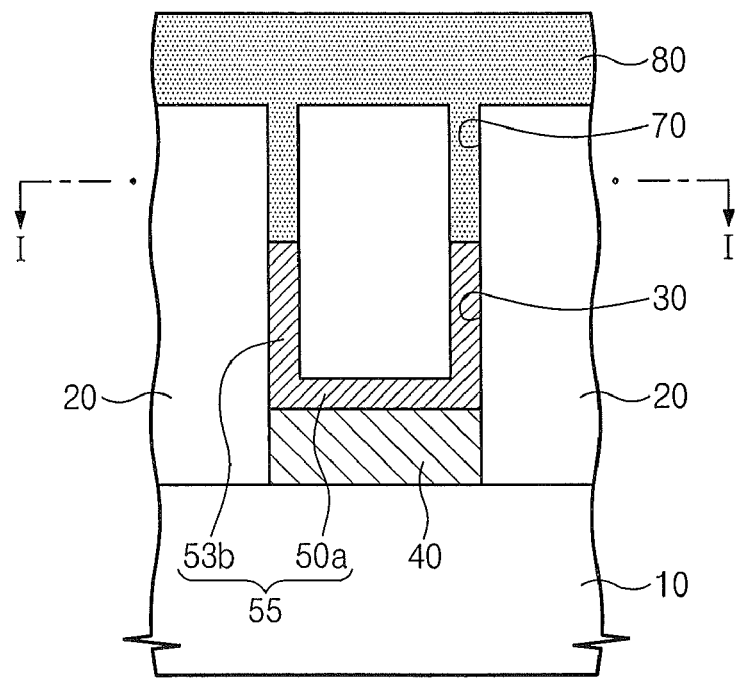
Figure 5B:
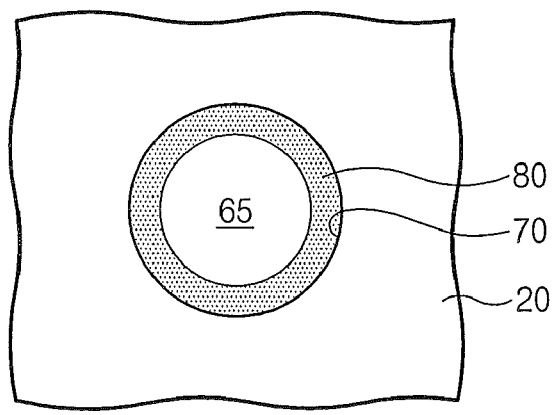

Referring to FIGS. 5A and 5B, a phase change material layer 80 for filling the second opening 70 may be formed on the first and second dielectrics 20 and 65. The phase change material layer 80 may be formed, for example, by performing an ALD process or a CVD process to yield reactive radicals including precursors for a phase change material and nitrogen. The precursors for the phase change material may include at least one amine group. The precursors for the phase change material may also include at least one of a hydrocarbon group, and may be an alkyl group, an alkenyl group, an alkynyl group, or an allenic group. "Alkyl" as used herein, refers to a straight or branched chain hydrocarbon containing from 1 to 10 carbon atoms. Representative examples of alkyl include, but are not limited to, methyl, ethyl, n-propyl, iso-propyl, n-butyl, sec-butyl, iso-butyl, tert-butyl, n-pentyl, iso-pentyl, neopentyl, n-hexyl, 3-methylhexyl, 2,2-dimethylpentyl, 2,3-dimethylpentyl, n-heptyl, n-octyl, n-nonyl, n-decyl, and the like. "Alkenyl" as used herein, refers to a straight or branched chain hydrocarbon containing from 2 to 12 carbon atoms which include 1 to 4 double bonds in the normal chain. Representative examples of alkenyl include, but are not limited to, vinyl, 2-propenyl, 3-butenyl, 2-butenyl, 4-pentenyl, 3-pentenyl, 2-hexenyl, 3-hexenyl, 2,4-heptadiene, and the like. "Alkynyl" as used herein, refers to a straight or branched chain hydrocarbon containing from 2 to 13 carbon atoms which include 1 triple bond in the normal chain. Representative examples of alkynyl include, but are not limited to, 2-propynyl, 3-butynyl, 2-butynyl, 4-pentynyl, 3-pentynyl, and the like. "Allenic" as used herein alone or as part of another group refers to a straight or branched chain hydrocarbon containing 1-10 carbon atoms in which one atom of carbon is connected by double bonds with two other atoms of carbon.

The phase change material layer 80 may be formed of, for example, a chalcogen compound such as Ge—Sb—Te (GST), Ge—Bi—Te (GBT), As—Sb—Te, As—Ge—Sb—Te, Sn—Sb—Te, In—Sn—Sb—Te, Ag—In—Sb—Te, a group 5A periodic table element-Sb—Te, a group 6A periodic table element-Sb—Te, a group 5A periodic table element-Sb—Se, a group 6A periodic table element-Sb—Se, etc., or of an above-cited chalcogen compound doped with an impurity. An impurity doped in a chalcogen compound may include, for example, nitrogen, oxygen, silicon, and any combinations thereof.

Below, An exemplary description will be provided of a method of forming the phase change material layer 80 using a germanium precursor, an antimony precursor, and a tellurium precursor as the phase change material.

Figure 11:
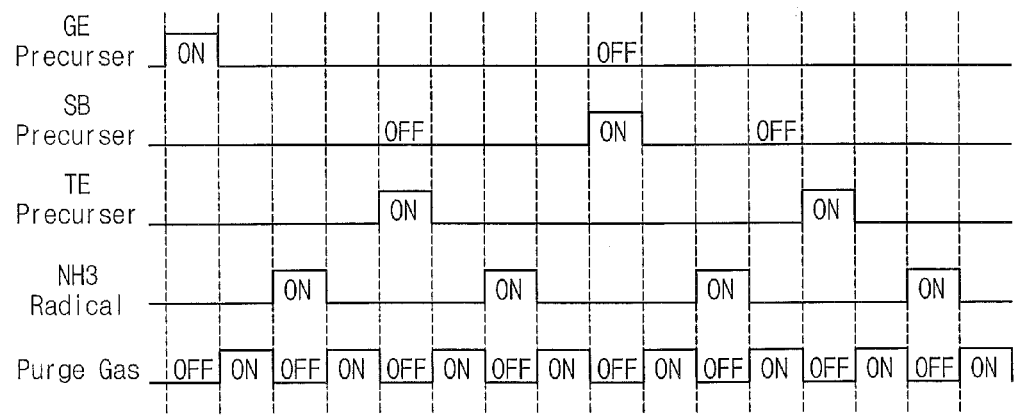
FIG. 11 is a diagram for describing a method of forming a phase change material layer according to an embodiment of the present invention.

Referring to FIG. 11, a method of forming a phase change material layer of the present invention will be described.

Precursors for phase change materials, including a germanium (Ge) precursor, an antimony (Sb) precursor, and a tellurium (Te) precursor, may be provided in a processing chamber (not shown) in which a substrate is disposed. The Ge precursor may have a chemical formula of $GeR^1_x(NR^2R^3)_{4-x}$ (where $0 \leq x \leq 3$, and x is a positive integer), the Sb precursor may have a chemical formula of $SbR^1_y(NR^2R^3)_{3-y}$ (where $0 \leq y \leq 2$, and y is a positive integer), and the tellurium precursor may have a chemical formula of $TeR^1_z(NR^2R^3)_{2-z}$ (where $0 \leq z \leq 2$, and z is a positive integer).

$R^1$, $R^2$, and $R^3$ may be from the hydrogen or hydrocarbon groups. The Te group may be an alkyl group, an alkenyl group, an alkynyl group, or an allenic group as defined previously. $R^1$, $R^2$, and $R^3$ may be the same or different. When there is a plurality of $R^1$ (or $R^2$ and $R^3$), respectively, the respective numbers of $R^1$ (or $R^2$ and $R^3$) may be the same or different. That is, the exponents 1, 2, and 3 of R denote the combining positions of R, and do not limit the type. For example, when x is 2 in a chemical formula for the Ge precursor, the Ge precursor has a chemical formula of $GeR^1_2(NR^2R^3)_2$, and two $R^1$s coupling to the Ge atoms may be the same or different. Also, two $R^2$s coupling to the two respective nitrogen atoms may be the same or different. That is, the precursor 1 denotes the combining of Ge atoms and does not limit the type. Also, exponents 2 and 3 denote coupling of nitrogen atoms of an amine group and do not limit the type.

The precursors for the phase change material may be serially and alternatingly provided. That is, the precursors for the phase change material may be provided in repeating sequences of Ge—Te—Sb precursors.

Reactive radicals including nitrogen are also provided in the processing chamber. The reactive radicals may have the chemical formula of $NR_nH_{3-n}$ or $N_2R_nH_{4-n}$ (where $0 \leq n \leq 2$, and n is a positive integer), and R may be a hydrocarbon group. The hydrocarbon group may be an alkyl group, an alkenyl group, an alkynyl group, or an allenic group as defined previously.

The reactive radicals may be formed outside the processing chamber and then provided in the processing chamber, or may be formed through high frequency or low frequency plasma processing within the processing chamber.

The reactive radicals may be provided between ON-type regions and provided with the precursors for the phase change material. That is, the reactive radicals may be provided after one of the Ge precursors, the Sb precursors, and the Te precursors is provided, and before the other precursors are provided. For example, the reactive radicals may be provided respectively after the Ge precursors are provided and before the Te precursors are provided, after the Te precursors are provided and before the Sb precursors are provided, after the Sb precursors are provided and before the Te precursors are provided, or after the Te precursors are provided and before the Ge precursors are provided.

The reactive radicals react with the precursors for the phase change material to form a phase change material layer at a low temperature. The reaction may, for example, be a transamination reaction. For descriptive simplicity, an exemplary chemical formula of the precursors for the phase change material, in which x and y are designated as 0, z is designated as 2, $R^1$, $R^2$, and $R^3$ are the same, and the reactive radicals including nitrogen are $NH_3$ radicals, has been provided. That is, the Ge precursors, the Sb precursors, and the Te precursors may be respectively represented as $Ge(NR_2)_4$, $Sb(NR_2)_4$, and $TeR_2$.

The Ge precursors, $Ge(NR_2)_4$, and the Sb precursors, $Sb(NR_2)_4$, may respectively react with the $NH_3$ radicals to yield reaction formulas 1 and 2, for example, having a first compound $Ge(NH_2)_4$ and a second compound $Sb(NH_2)_4$.

  Reaction Formula 1

  Reaction Formula 2

The first and second compounds respectively react with the Te precursor $TeR_2$ in a processing temperature ranging from about 150° C. to about 250° C. to allow a GeTe layer and an SbTe layer of a GeSbTe phase change material layer to be formed. That is, the phase change material layer may be formed at a low temperature ranging from about 150° C. to about 250° C. by performing an ALD process or a CVD process.

In regions in which Ge precursors, Sb precursors, Te precursors, and reactive radicals are not provided, a purge gas such as an inert gas like argon may be provided within the processing chamber.

Figure 12:
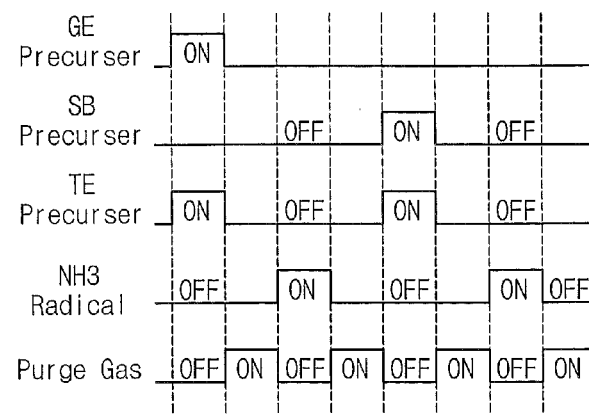
FIG. 12 is a diagram for describing another method of forming a phase change material layer according to another embodiment of the present invention.

Referring to FIG. 12, a forming method of a phase change material layer according to another embodiment of the present invention will be described. In the present embodiment, descriptions already provided in previous embodiments will not be repeated.

The Ge precursor and the Sb precursor may be sequentially and alternatingly provided, and the Te precursor may be provided together with the Ge precursor and the Sb precursor. After one of the Ge precursor and the Sb precursor is provided, the reactive radicals may be provided before the other precursor may be provided. For example, after the Ge precursor and the Te precursor are provided in the processing chamber, reactive radicals may be provided. Then, the Sb precursor and the Te precursor may be provided, and then the reactive radicals may be provided. By thus providing two types of precursors simultaneously to the processing chamber, processing time can be reduced.

Figure 6A:
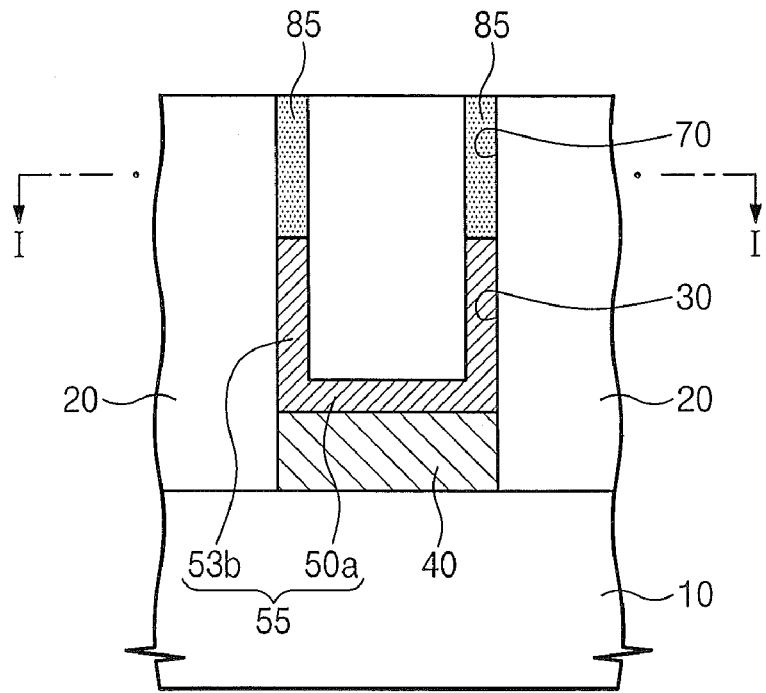
Figure 6B:
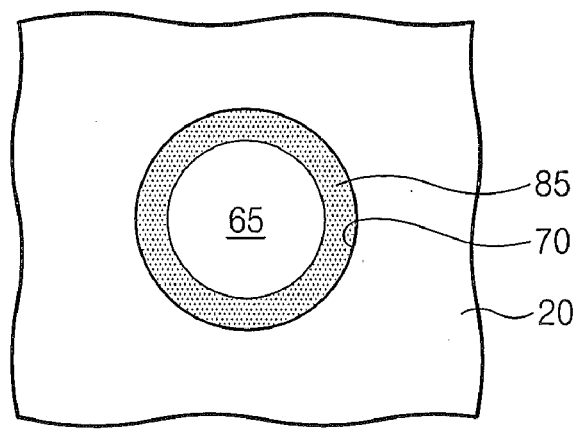

Referring to FIGS. 6A and 6B, planarization processing such as CMP or etch back processing may be performed to remove the phase change material layer outside the second opening 70 and to form a phase change material layer 85 limited to within the second opening 70. An etch back process for removing a portion of the phase change material layer 80 may employ a plasma of an inert gas such as helium, neon, argon, krypton, and xenon. Alternatively, an ion beam in a dry etching process may be used. In another alternative, a CMP process for the phase change material layer 80 may use high etch selectivity conditions for the first dielectric 20 and the second dielectric 65 to remove the phase change material layer 80 outside the second opening 70.

As described above, because the phase change material layer 85 may be formed after the formation of the second dielectric 65, the process of forming the second dielectric 65 affecting the forming of the phase change material layer 85 may be prevented. That is, because the phase change material layer 85 does not need to be considered, the formation of conditions of the second dielectric 65 may be set in various ways. There is no need to form the second dielectric 65 in a low temperature process (under 300° C., for example) that will not affect the phase change material layer 85. For example, because the second dielectric 65 can be formed in high temperature processing conditions with good gap filling characteristics, the second dielectric 65 may be formed to fill the first opening 30 without the creation of voids in the first opening 30. For example, a high temperature depositing process performed at a temperature of 300° C. or higher for superb step coverage may be used to form the second dielectric 65.

Figure 7A:
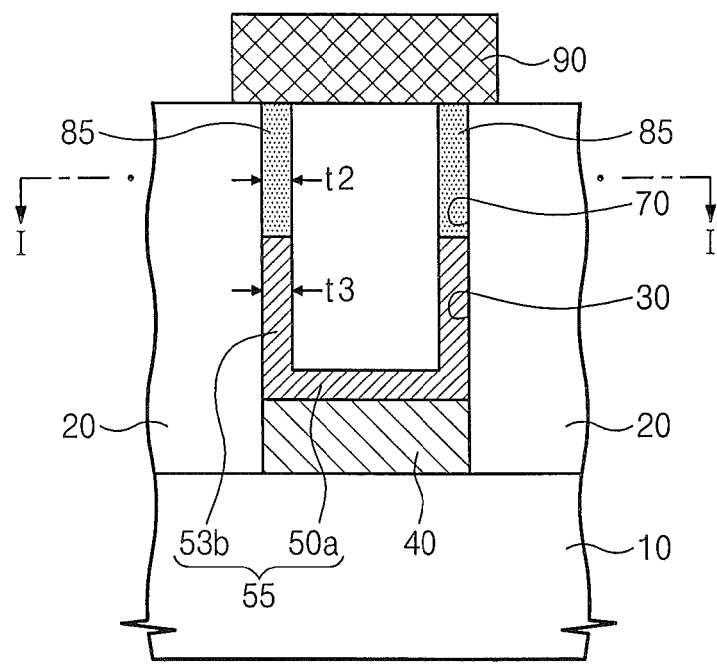
Figure 7B:
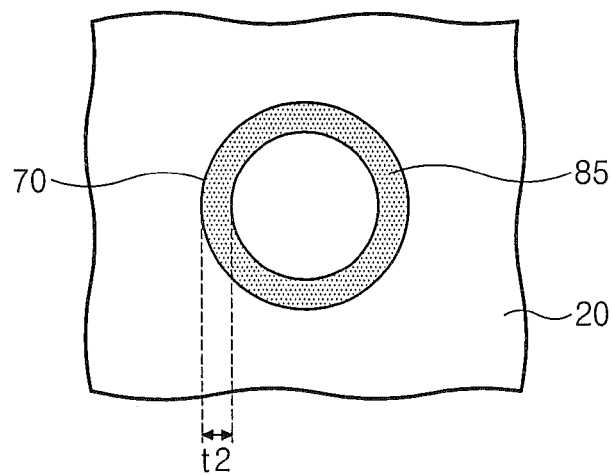

Referring to FIGS. 7A and 7B, a conductive layer including the phase change material layer 85 and the second dielectric 65 are formed on the first dielectric 20, and patterning is performed to form a second conductor 90 connected to the phase change material layer 85. The second conductor 90 may be formed, for example, of titanium (Ti) and a titanium nitride material that are stacked in sequence.

A phase change memory device according to an embodiment of the present invention may include the phase changer material layer 85 provided in the first opening 30 of the first dielectric 20, and the first conductor 55 for supplying a signal to change the resistivity of the phase change material layer 80. The second conductor 90 may be connected to the phase change material layer 85. The second conductor 90, like the first conductor 55, supplies a signal to change the resistivity of the phase change material layer 85.

The phase change material layer 85 may be a material that can be changed reversibly between a plurality of crystalline states with different resistivities, depending on heat. As a signal for changing the crystalline state of the phase change material layer 85, an electrical signal such as a current and a voltage, an optical signal, or radiation may be employed. For example, if a current is applied between the first conductor 55 and the second conductor 90, the phase change material layer 85 may be heated through resistance heating, and the heated state of the phase change material layer 85 may change according to the amount of generated heat.

The first opening 30, to which the phase change material layer 85 and the first conductor 55 may be provided according to the present invention, may be embodied as a contact hole or a recess, for example, and may be embodied in various other forms. The recess may be substantially parallel to a word line or a bit line. The first opening 30 may include a bottom and a sidewall. In the present invention, the floor of the first opening 30 may refer to a region proximate to the substrate, and the sidewall of the first opening 30 may refer to the side surface of the first dielectric 20 limiting the first opening 30. Also, the sidewall of the first opening 30 may be divided into an upper sidewall provided with the phase change material layer 85, and a lower sidewall provided with the first conductor 55.

According to an embodiment of the present invention, the phase change material layer 85 and the first conductor 55 may be formed limited to the first opening 30 of the first dielectric 20. Therefore, the contacting areas between the phase change material layer 85 and the first conductor 55 and/or between the phase change material layer 85 and the second conductor 90 may be reduced, and thus a memory device capable of low power operation may be formed. Also, the second dielectric 65 may be further provided at the center of the first opening 30. The second dielectric 65 may include a first and second surface facing one another and a third surface connecting the first and second surfaces, to form a three-dimensional structure. That is, the second dielectric 65 may have an upper surface adjacent to the second conductor 90, a second surface adjacent to the sidewall of the first opening 30, and a bottom surface adjacent to the floor of the first opening 30.

For example, the second dielectric 65 may be provided at the centers of the first dielectric 20 and the first opening 30, whereupon the phase change material layer 85 and the first conductor 55 may be provided in a space defined between the first dielectric 20 and second dielectric 65. That is, the first conductor 55 may be provided to cover a portion of the floor of the second dielectric 65 and the side adjacent to the floor, and the phase change material layer 85 may be provided to cover a portion of the side adjacent to the upper surface of the second dielectric 65. Specifically, the side surface of the second dielectric 65 may be divided into an upper side portion covered by the phase change material layer 85, and a lower side portion covered by the first conductor 55. The second conductor 90 may be provided on the phase change material layer 85, the first dielectric 20, and the second dielectric 65.

The first conductor 55 may include a first region 50*a* provided at the floor of the first opening 30, and a second region 53*b* extending from the first region 50*a* and provided on the lower sidewall of the first opening 30. That is, the first region 50*a* of the first conductor 55 may be provided on the lower surface of the second dielectric 65, and the second region 53*b* may be provided on the lower side surface of the second dielectric 65. The phase change material layer 85 may be provided on the sidewall of the first opening 30 adjacent to the second conductor 90. Specifically, the phase change material layer 85 may be provided on the upper side portion of the second dielectric 65.

Thus, according to an embodiment of the present invention, because the phase change material layer 85 may be restricted to a very narrow region between the first dielectric 20 and the second dielectric 65, the contacting areas between the phase change material layer 85 and the conductors 55 and 90 may be further reduced.

Referring again to FIGS. 7A and 7B, the first opening 30 of the first dielectric 20 may be configured as a contact hole. The shape of the contact hole may not only be circular as illustrated, but may be one of various other shapes according to forming processes the selection of which will be within the skill of one in the art. The second dielectric 20 may be provided at the central portion of the first opening 30 in the form of a contact hole, and the geometric shape of the second dielectric 20 may be a cylindrical column. Accordingly, the phase change material layer 85 may be annular, for example. The second region 53*b* of the first conductor 55 adjacent to the phase change material layer 85 may be annular, like the phase change material layer 85. Also, the first region 50*a* of the first conductor 55 may be provided on the floor of the first opening 30. Thus, the first conductor 55 may have a cup-shaped geometrical configuration.

The phase change material layer 85 may be provided along the upper sidewall of the first opening 30 adjacent to the second conductor 90. For example, the phase change material layer 85 may be formed with a uniform width (t2) along the upper sidewall of the first opening 30 (or the upper side surface of the second dielectric 65). Likewise, the second region 53*b* of the first conductor 55 may be formed with a uniform width (t3) along the lower sidewall of the first opening 30 (or the lower side surface of the second dielectric 65). Here, the term 'width' used to describe the phase change material layer 85 and the second region 53*b* of the first conductor 55 refers to the distance measured from the sidewall of the first opening 30 (or a distance measured from a side of the second dielectric 65). In an embodiment of the present invention, the width (t2) of the phase change material layer 85 and the width (t3) of the second region 53*b* of the first conductor 55 may be substantially the same. In an embodiment, the upper surface of the phase change material layer 85 may be substantially the same height as the upper surface of the second dielectric 65 and/or the upper surface of the first dielectric 20.

In an embodiment of the present invention, the portion of the phase change material layer 85 adjacent to the second conductor 90 and the portion of the phase change material layer 85 adjacent to the first conductor 55 may have sectional shapes or geometric shapes that are substantially the same. For example, the overlapping surfaces of the first conductor 55 and the phase change material layer 85 and the overlapping surfaces of the second conductor 90 and the phase change material layer 85 may be substantially the same in area or in the same in geometric shape. Accordingly, in an embodiment of the present invention, in order to change the crystallized state of the phase change material layer 85, one or both of the first conductor 55 and the second conductor 90 may be used as a heating electrode. That is, the phase change material layer 85 adjacent to the first conductor 55 and/or the phase change material layer 85 adjacent to the second conductor 90 may be changed in terms of its crystallized state. For example, according to an embodiment of the present invention, the crystallized state of the phase change material layer 85 may be changed in two regions to faun a multi-level memory device.

According to an embodiment of the present invention, a conductive pattern 40 with excellent thermal conductivity may be further provided between the first conductor 55 and the bottom of the first opening 30. That is, the first conductor 55 may be provided between the conductive pattern 40 and the phase change material layer 85. Compared to a structure in which the conductive pattern 40 with superb thermal conductivity directly contacts the phase change material layer 85. In another embodiment of the present invention, the structure with the first conductor 55 provided between the conductive pattern 40 and the phase change material layer 85 may reduce operating current.

The first conductor 55 may be, for example: a metal such as titanium, hafnium, zirconium, vanadium, niobium, tantalum, tungsten, aluminum, copper, tungsten titanium, and molybdenum; a binary metal nitride such as titanium nitride, hafnium nitride, zirconium nitride, vanadium nitride, niobium nitride, tantalum nitride, tungsten nitride, and molybdenum nitride; a metal oxide such as iridium oxide and ruthenium oxide; a ternary metal nitride such as titanium carbon nitride, tantalum carbon nitride, titanium silicon nitride, tantalum silicon nitride, titanium aluminum nitride, tantalum aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum oxide nitride, titanium oxide nitride, and tungsten oxide nitride; silicon; or a combination of the above. In one embodiment, the first conductor 55 may be formed of titanium nitride.

The second conductor 90 may be, for example, a metal such as titanium, hafnium, zirconium, vanadium, niobium, tantalum, tungsten, aluminum, copper, tungsten titanium, and molybdenum; a binary metal nitride such as titanium nitride, hafnium nitride, zirconium nitride, vanadium nitride, niobium nitride, tantalum nitride, tungsten nitride, and molybdenum nitride; a metal oxide such as iridium oxide and ruthenium oxide; a ternary metal nitride such as titanium carbon nitride, tantalum carbon nitride, titanium silicon nitride, tantalum silicon nitride, titanium aluminum nitride, tantalum aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum oxide nitride, titanium oxide nitride, and tungsten oxide nitride; silicon; or a combination of the above. In one embodiment, the second conductor 90 may be formed of titanium and titanium nitride stacked in sequence.

The second conductor 90 may also be formed of aluminum (Al), an aluminum copper alloy (Al—Cu), an aluminum copper silicon compound (Al—Cu—Si), tungsten silicide (WSi), copper (Cu), tungsten titanium (TiW), tantalum (Ta), molybdenum (Mo), tungsten (W), or a combination of the above.

The conductive pattern 40 may be, for example, a metal such as titanium, hafnium, zirconium, vanadium, niobium, tantalum, tungsten, aluminum, copper, tungsten titanium, and molybdenum; a binary metal nitride such as titanium nitride, hafnium nitride, zirconium nitride, vanadium nitride, niobium nitride, tantalum nitride, tungsten nitride, and molybdenum nitride; a metal oxide such as iridium oxide and ruthenium oxide; a ternary metal nitride such as titanium carbon nitride, tantalum carbon nitride, titanium silicon nitride, tantalum silicon nitride, titanium aluminum nitride, tantalum aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum oxide nitride, titanium oxide nitride, and tungsten oxide nitride; silicon; or a combination of the above. In an embodiment, the conductive pattern 40 may be formed of tungsten.

The first dielectric 20 and the second dielectric 65 may be respectively formed of a silicon nitride layer, a silicon oxide nitride layer, or a combination thereof In an embodiment, the first dielectric 20 and the second dielectric may be formed of the same material.

Figure 8:
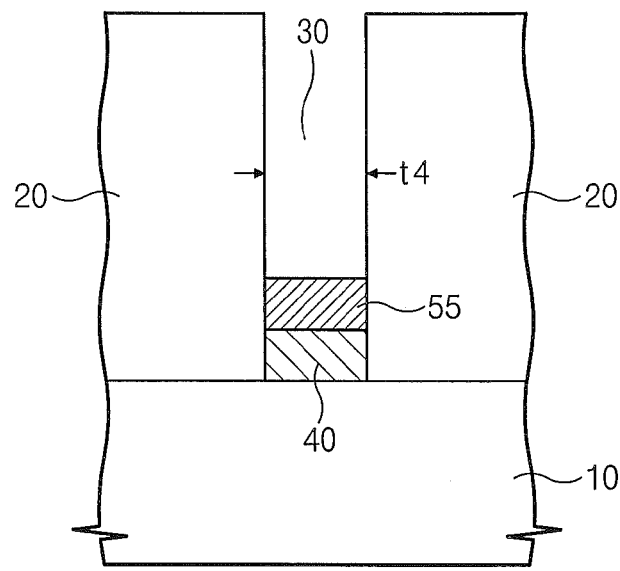
FIGS. 8 through 10 are sectional views illustrating a phase change memory device and a method of forming the same according to another embodiment of the present invention.
Figure 9:
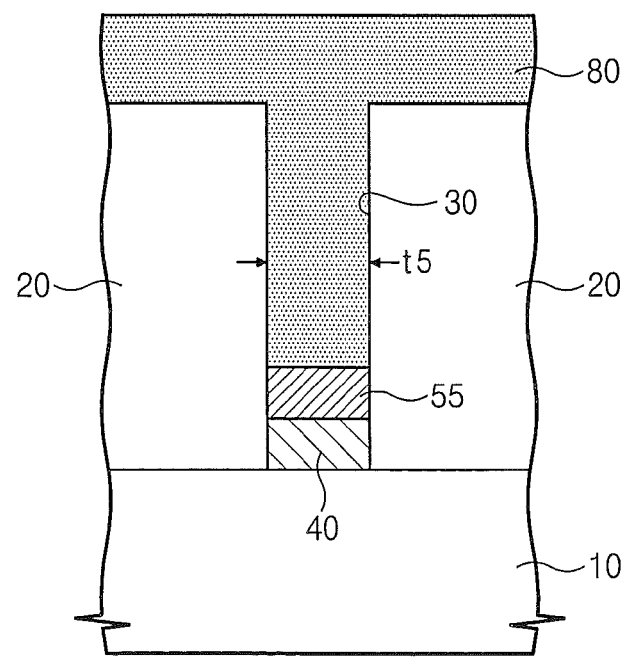
Figure 10:
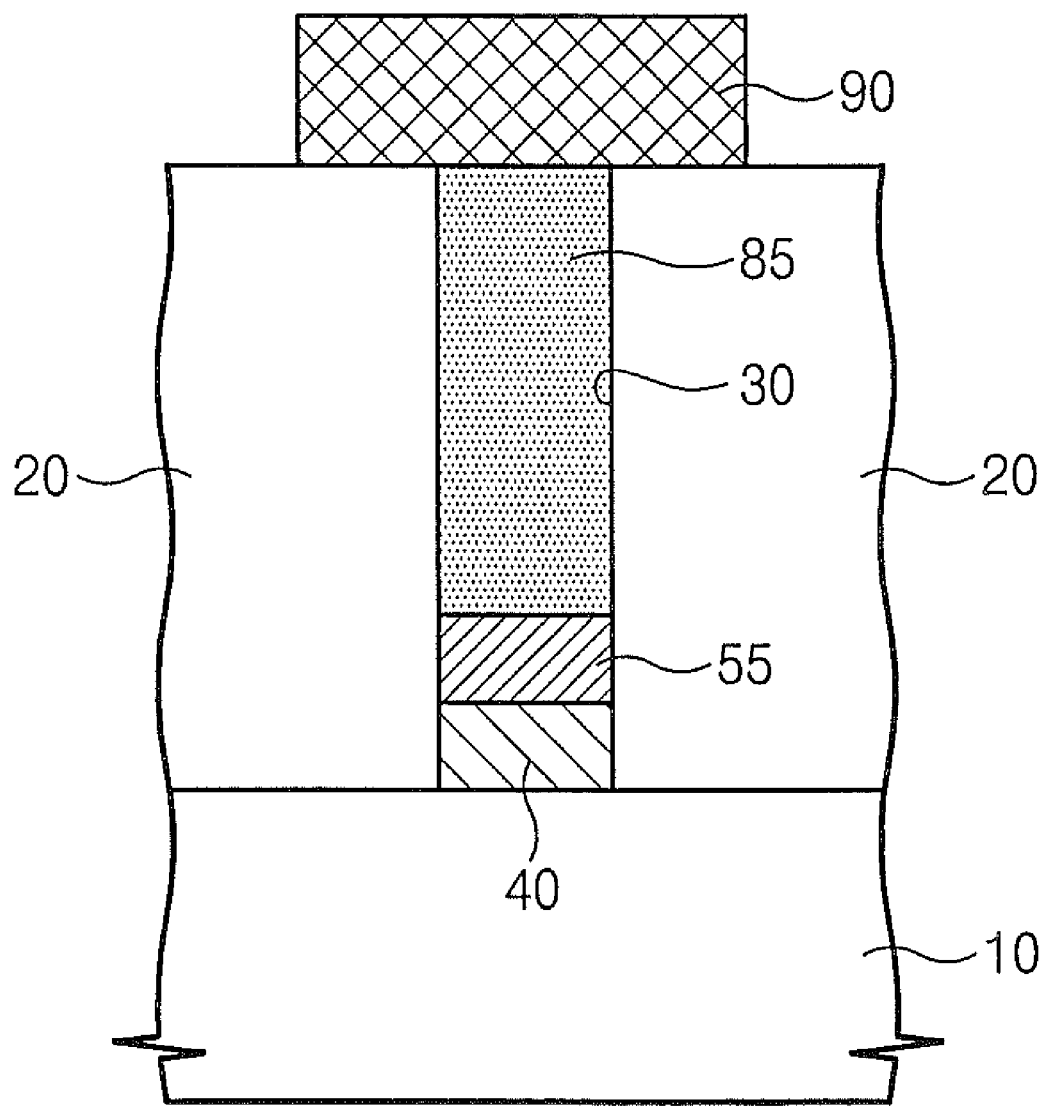

Referring to FIGS. 8 through 10, a phase change memory device and a method of forming the memory device, according to another embodiment of the present invention, will be described. Repetitive descriptions in the above embodiments may be omitted.

Referring to FIG. 8, the first dielectric 20 restricting the first opening 30 may be formed on the substrate 10. The first dielectric 20 may be formed, for example, of silicon oxide, silicon nitride, silicon oxide nitride, or a combination thereof. The first opening 30 may be configured in a contact hole shape or a recessed shape. The first opening 30 may be formed, for example, through performing an etching process to remove a predetermined portion of the first dielectric 20. The width (t4) of the first opening 30 may be 50 nm or less, and may range, for example, from about 5 nm to about 50 nm.

The conductive pattern 40 and the first conductor 55 may be formed on the floor of the first opening 30. The conductive pattern 40, for example, may be formed by first forming a conductive layer on the first dielectric 20 to fill the first opening 30, using an ALD process or a CVD process, and then performing a CMP process and/or an etch back process. The conductive pattern 40 may be formed of tungsten, for example. The first conductor 55, for example, may be formed by first forming a conductive layer on the conductive pattern 40 to fill the first opening 30, using an ALD process or a CVD process, and then performing a CMP process and/or an etch back process. The first conductor 55 may be formed of titanium nitride, for example.

Referring to FIG. 9, the phase change material layer 80 may be formed on the first dielectric 20 to fill the first opening 30. The phase change material layer 80 may be formed, for example, by providing a material including precursors for phase change and nitrogen to provide reactive radicals on a substrate, and performing an ALD or CVD process. The method for forming the phase change material layer 80 may be performed in the same way as the above-described embodiments, and will therefore not be described.

Referring to FIG. 10, the phase change material layer outside the first opening 30 may be removed through performing a planarization process such as CMP or etch back, to form a phase change material layer 85 restricted to within the first opening 30. The width (t5) of the phase change material layer 85 may be less than or equal to the width (t4) of the first opening 30. That is, the width (t5) of the phase change material layer 85 may be 50 nm or less, or about 5 nm to about 50 nm. To remove a portion of the phase change material layer 80, a dry etching process such as an etch back process, using plasma from inert gases such as, for example, helium, neon, argon, krypton, and xenon, or an ion beam may be used. The CMP process for the phase change material layer 80 may be performed under etching conditions with a high etch selectivity for the first dielectric 20 to remove the phase change material layer 80 outside of the opening 30.

A conductive layer may be formed on the first dielectric 20 including the phase change material layer 85, and patterning is performed to form the second conductor 90 connected to the phase change material layer 85. The second conductor 90 may, for example, be formed of titanium and titanium nitride stacked in sequence.

Figure 13A:
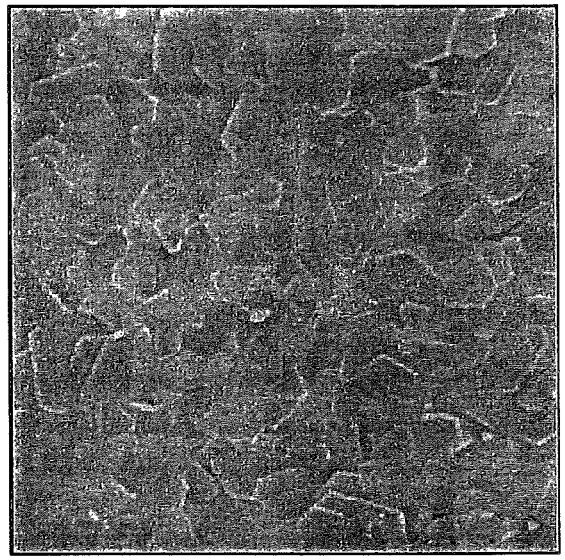
FIGS. 13A and 13B are scanning electron microscope (SEM) images of phase change material layers formed with typical methods.
Figure 13B:
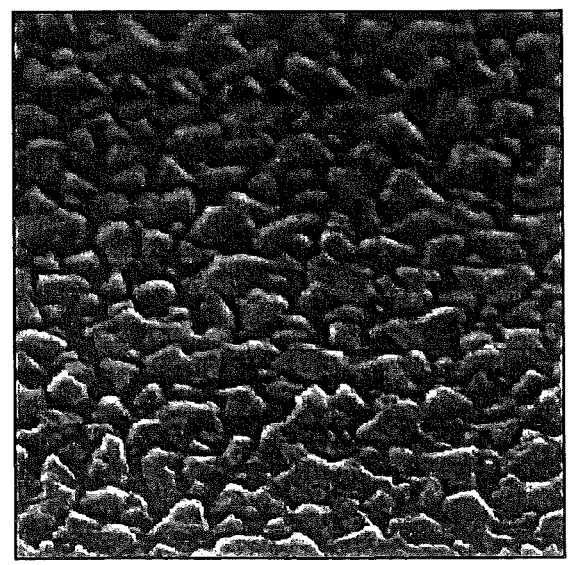
Figure 13C:
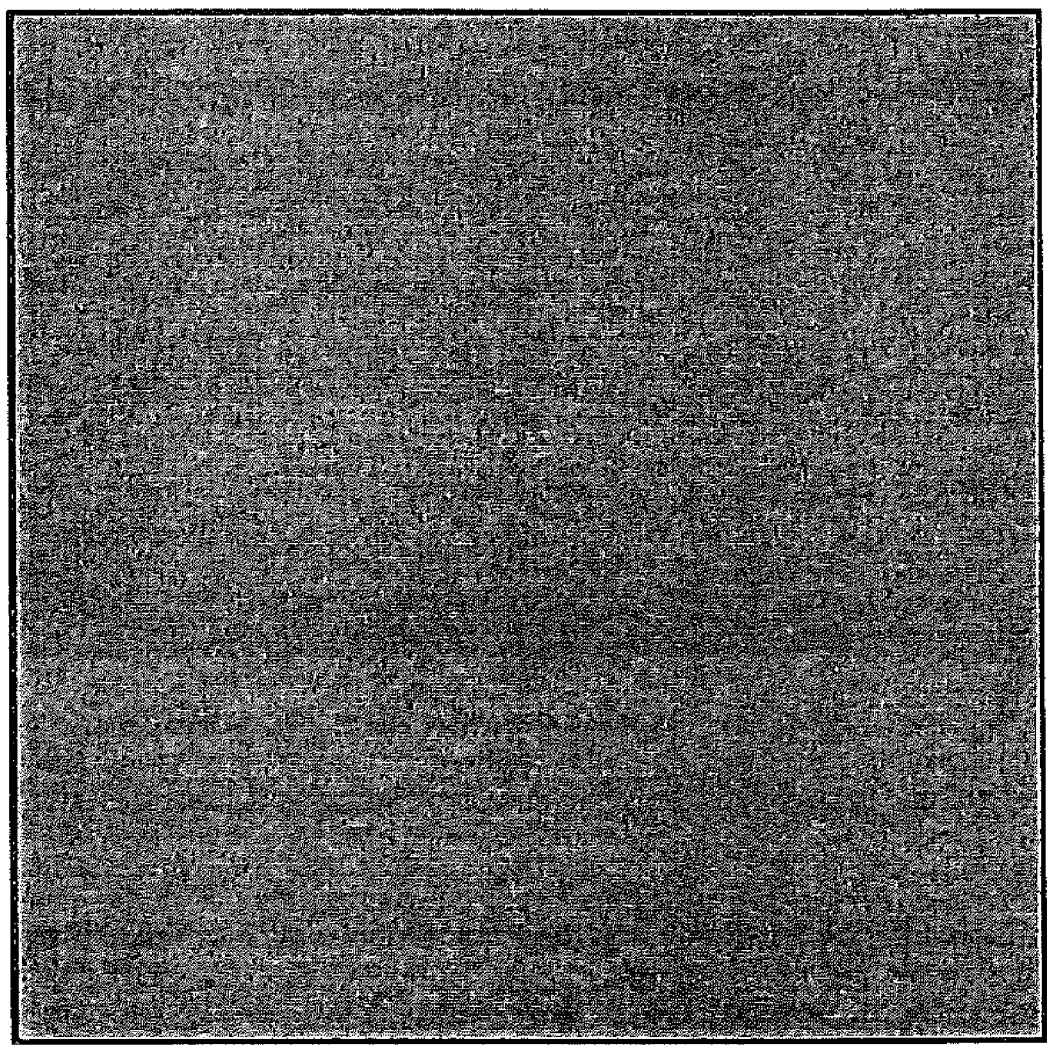
FIG. 13C is an SEM image of a phase change material layer formed with a method according to an embodiment of the present invention.

FIGS. 13A and 13B are SEM images of phase change material layers formed with typical methods at temperatures of 350° C. and 300° C., respectively, and FIG. 13C is an SEM image of a phase change material layer formed with a method employing plasma enhanced atomic layer deposition (PEALD) at a temperature of 170° C., according to an embodiment of the present invention.

While the phase change material layer in FIG. 13A may be relatively uniform, it may have a large grain size of about 200 nm, and the phase change material layer in FIG. 13B may have pronounced roughness and non-uniformity. The grain size of the phase change material layer in FIG. 13B may range from about 60 nm to about 65 nm. Thus, while its grain size is smaller than that of the phase change material layer illustrated in FIG. 13A, openings of 50 nm or less cannot be filled.

Conversely, the phase change material layer illustrated in FIG. 13C is not only uniform, but also has a substantially smaller grain size than its counterpart in FIG. 13B. The grain size of the phase change material layer in FIG. 13C may be about 10 nm. Accordingly, a phase change material layer according to embodiments of the present invention may uniformly fill openings of 50 nm or less. While typical methods require the forming of a seed layer such as titanium oxide and tantalum oxide to form a phase change material layer at a high temperature of 300° C. or more, when forming a phase change material layer at low temperatures of 250° C. or less, according to embodiments of the present invention, there is no need to form a seed layer, thereby simplifying processing.

That is, according to present embodiments, because a phase change material layer may be formed at low temperatures of 250° C. or less, it may be uniformly formed. Also, because the size of the grains composing the phase change material layer may be substantially reduced, the phase change material layer may fill openings of 50 nm or less. Thus, the contacting areas between the phase change material layer and the conductors above and below it may be reduced, enabling higher integration of the phase change memory device.

Figure 14:
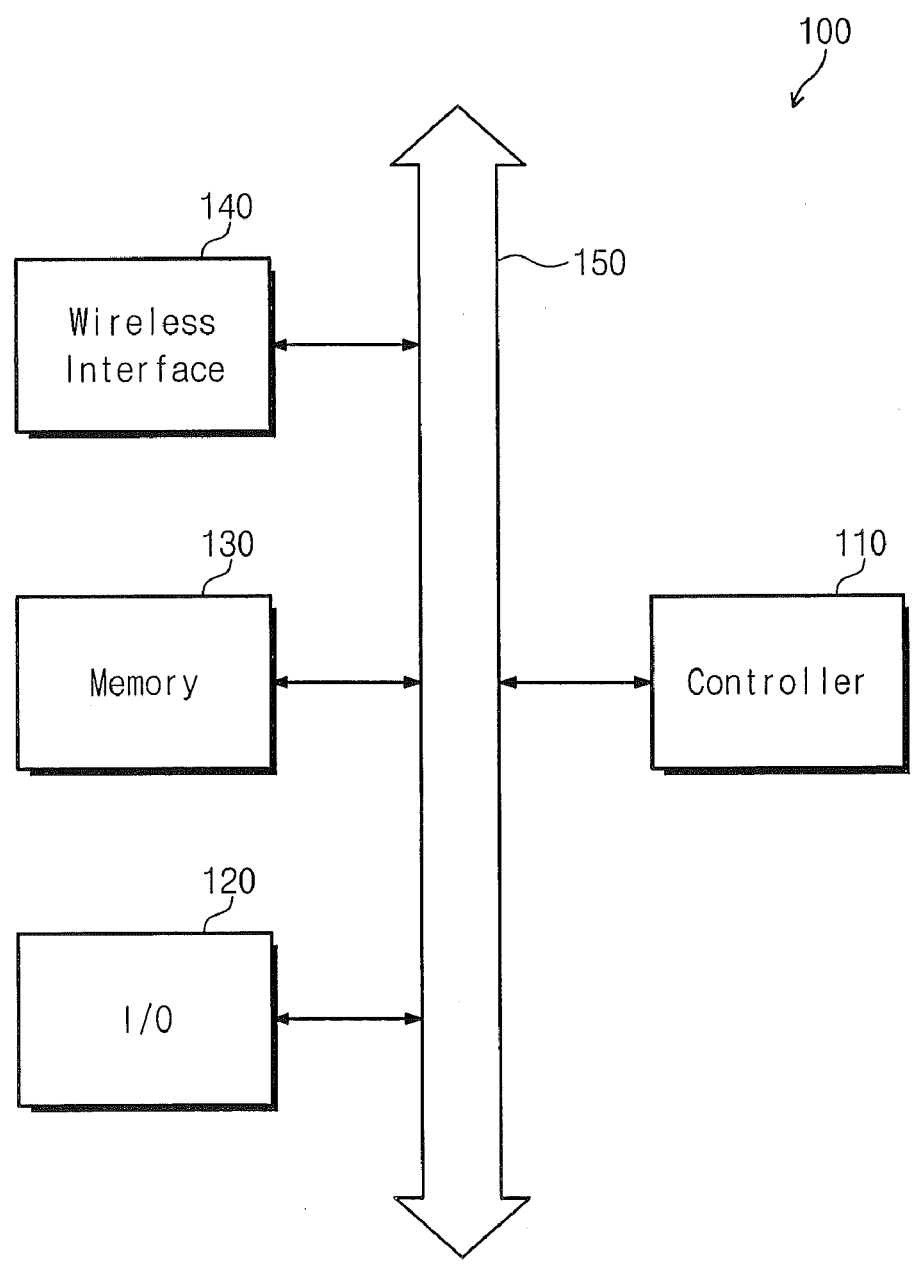
FIG. 14 is a schematic diagram of system with a phase change memory device according to embodiments of the present invention.

FIG. 14 is a schematic diagram of a system including a phase change memory device according to embodiments of the present invention. The system 100 may be applied to wireless communication devices such as, for example, personal digital assistants (PDA), laptop computers, portable computers, web tablets, cordless phones, mobile phones, digital music players, and all other devices capable of sending and/or receiving data in a wireless environment.

The system 100 may include components linked through a bus 150, including: a controller 110; input/output (I/O) 120 devices such as a keypad, a keyboard, and a display; a memory 130; and a wireless interface 140. The controller 110, for example, may include one or more of a microprocessor, a digital signal processor, a micro controller, and similar devices. The memory 130 may be used, for example, to store commands for operations performed by the controller 110. The memory 130 may also be used to store user data. The memory 130 includes a phase change memory according to embodiments of the present invention. The memory 130 may further include other types of memories, including volatile memories that are always accessible and various other types of memories.

The system 100 may employ a wireless interface 140 that communicates using radio frequency (RF) signals, for transmitting data in a wireless communication network or receiving data through the network. The wireless interface 140 may include an antenna, a wireless transceiver, etc., for example.

The wireless system 100 according to embodiments of the present invention may be used in a communication interface protocol such as a third generation code division multiple access (CDMA), groupe special mobile (GSM), North American digital communications (NADC), enhanced time division multiple access (E-TDMA), wideband CDMA (WCDMA), CDMA 2000, etc.

According to embodiments of the present invention, because a phase change material layer can be formed at a low temperature, the phase change material layer may be uniformly formed, and the size of grains constituting the phase change material layer may be reduced. Accordingly, a phase change material layer may be formed with a minimal width. Thus, a phase change memory device may be highly integrated, and the contacting areas between the phase change material layer and the conductors above and below it may be reduced, so that the phase change memory device may operate under low power. Therefore, the operational characteristics of the phase change memory device may be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A phase change memory device comprising:
 a substrate including a first conductor comprising a first portion provided on a bottom of the opening, and a second portion provided extending from the first portion and along a sidewall of the opening;
 a first dielectric layer having an opening exposing the first conductor;
 a phase change material layer provided within the opening wherein the phase change material layer is provided connected to the second portion of the first conductor and along the sidewall of the opening; and
 a second conductor provided on the phase change material layer, wherein the phase change material layer has a width of about 50 nm or less.

2. The phase change memory device of claim 1, wherein the phase change material layer comprises grains with a size of about 10 nm or less.

3. The phase change memory device of claim 1, further comprising a second dielectric layer provided within the opening, wherein the second portion of the first conductor and the phase change material layer are disposed between the first dielectric layer and the second dielectric layer.

4. The phase change memory device of claim 3, wherein the phase change material layer is configured annularly.

5. A phase change memory device comprising:
 a first dielectric layer having an opening exposing a substrate;
 a first conductor comprising a first portion provided on a bottom of the opening, and a second portion provided extending from the first portion and along a sidewall of the opening;
 a phase change material layer provided connected to the second portion of the first conductor and along the sidewall of the opening, wherein the phase change material layer has a width of about 50 nm or less;
 a second dielectric layer provided within the opening, wherein the second portion of the first conductor and the phase change material layer are disposed between the first dielectric layer and the second dielectric layer; and
 a second conductor provided on the phase change material layer, wherein the second conductor is in direct contact with top surfaces of the second dielectric layer and the phase change material layer.

6. The phase change memory device of claim 5, wherein a top surface of the phase change material layer is substantially coplanar with a top surface of the first dielectric layer.

7. The phase change memory device of claim 5, wherein the phase change material layer comprises grains with a size of about 10 nm or less.

* * * * *